United States Patent
Walls

[19]

[11] Patent Number: 5,926,734
[45] Date of Patent: Jul. 20, 1999

[54] SEMICONDUCTOR STRUCTURE HAVING A TITANIUM BARRIER LAYER

[75] Inventor: James Austin Walls, Mesa, Ariz.

[73] Assignee: Motorola, Inc., Schaumburg, Ill.

[21] Appl. No.: 08/906,032

[22] Filed: Aug. 5, 1997

[51] Int. Cl.⁶ .............................................. H01L 21/4763
[52] U.S. Cl. ........................ 438/627; 438/628; 438/643; 438/644; 438/653; 438/654; 438/656
[58] Field of Search .................... 438/627, 628, 438/643, 644, 653, 654, 656

[56] References Cited

U.S. PATENT DOCUMENTS

| | | | |
|---|---|---|---|
| 4,206,472 | 6/1980 | Chu et al. | 357/67 |
| 4,214,256 | 7/1980 | Dalal et al. | 357/71 |
| 4,783,248 | 11/1988 | Kohlhase et al. | 204/192 |
| 5,371,042 | 12/1994 | Ong | 437/192 |
| 5,378,660 | 1/1995 | Ngan et al. | 437/247 |
| 5,412,250 | 5/1995 | Hrugge | 257/750 |
| 5,504,043 | 4/1996 | Ngan et al. | 437/247 |
| 5,514,908 | 5/1996 | Liao et al. | 257/751 |
| 5,552,339 | 9/1996 | Hsich | 437/190 |
| 5,652,181 | 7/1997 | Thakur | 437/192 |

FOREIGN PATENT DOCUMENTS

0291462 B1  11/1988  European Pat. Off. ....... G01N 27/00

OTHER PUBLICATIONS

Research Disclosure Abstract from Derwent WPI database (RD 296091).

*Primary Examiner*—Richard A. Booth
*Assistant Examiner*—David A. Zarneke
*Attorney, Agent, or Firm*—Rennie William Dover

[57] ABSTRACT

A semiconductor structure (10) includes a semiconductor substrate (12), a silicon layer (18) overlying the semiconductor substrate, a dielectric layer (16) overlying the silicon layer and having a contact opening to expose a portion of the silicon layer, and a metal layer stack (20) overlying the dielectric layer and having a portion in contact with the silicon layer through the contact opening. The metal layer stack comprises a barrier layer (24) of titanium with incorporated oxygen (of greater than about 11 atomic percent) to provide diffusion resistance against, for example, platinum, oxygen, and silicon.

14 Claims, 1 Drawing Sheet

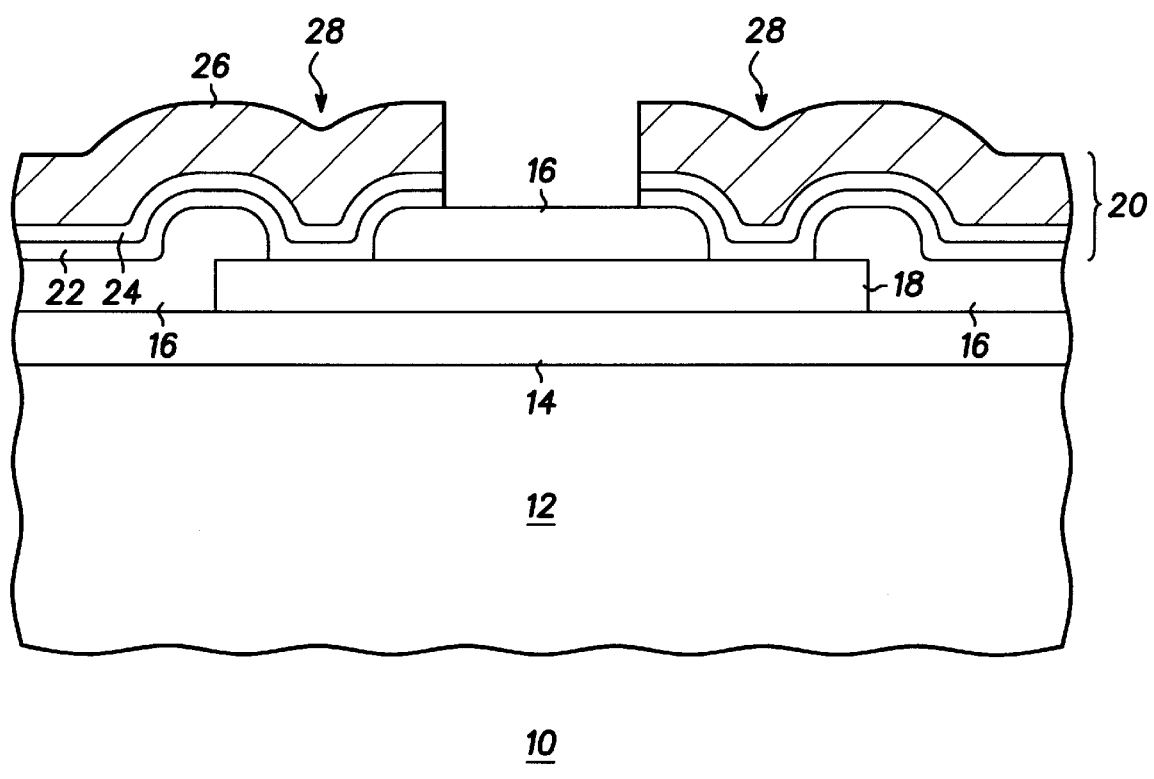

SEMICONDUCTOR STRUCTURE HAVING A TITANIUM BARRIER LAYER

BACKGROUND OF THE INVENTION

The present invention relates, in general, to semiconductor structures and, more particularly, to such structures having a barrier layer of titanium.

Diffusion barriers are typically used in semiconductor manufacturing when it is desired to prevent diffusion of certain materials used to form various conductive, semiconductive, or insulating layers of a semiconductor device. An example of one situation where it is desirable to prevent such diffusion is the formation of metal contacts to silicon, such as in a platinum to silicon contact. In the absence of a diffusion barrier between the platinum and silicon, platinum atoms diffuse into the bulk silicon material and silicon atoms diffuse into the bulk platinum material. Further, at the elevated operating temperatures typically used for semiconductor devices such as some chemical sensors, the platinum and silicon will diffuse and react to form platinum silicide at the contact interface. This diffusion and reaction severely degrade the quality of the contact, including an increase in contact resistance.

Also, in certain chemical sensor applications the sensor will be exposed to an oxygen-containing ambient. In the absence of a diffusion barrier, oxygen from the ambient being sensed can diffuse into interior portions of the sensor containing silicon and chromium, which can be oxidized by this diffused oxygen.

Accordingly, it would be desirable to have a diffusion barrier that would prevent diffusion of metals, silicon, and oxygen while maintaining contact integrity, including during operation at elevated temperatures.

BRIEF DESCRIPTION OF THE DRAWINGS

The sole FIGURE is a highly-enlarged cross-sectional view of a semiconductor structure including a barrier layer according to the present invention.

DETAILED DESCRIPTION OF THE DRAWING

The sole figure illustrates a semiconductor structure 10 with a barrier layer 24 according to the present invention. Structure 10 is for example a portion of a chemical sensor. Barrier layer 24 is a part of a metal layer stack 20 formed overlying an upper dielectric layer 16, a lower dielectric layer 14, and a semiconductor substrate 12, for example of silicon. According to the present invention barrier layer 24 is formed of titanium with oxygen atoms incorporated into its crystal structure to provide it with improved diffusion barrier properties. Additional details regarding barrier layer 24 are discussed below.

A silicon layer acting as a heater 18, for example of polysilicon, is used to increase the local temperature of structure 10 during operation. For example, heater 18 can be used to vary the temperature of the sensing element (not shown) of a chemical sensor. An example of such a sensor is a carbon monoxide sensor using a tin oxide sensing element, which is typically positioned in the proximity of heater 18 overlying upper dielectric layer 16. Also, although not shown here, other dielectric and conductive layers can be formed overlying or underlying metal layer stack 20, depending on the particular application.

Metal layer stack 20 includes barrier layer 24, an adhesion layer 22, and a top metal layer 26. Generally, top metal layer 26 will carry most of the current supplied to heater 18. Metal layer stack 20 forms contacts 28 to heater 18 through openings in upper dielectric layer 16 to provide an electrical path for this current. For use in chemical sensor applications that will be exposed to oxygen, it is desirable that top metal layer 26 substantially not be oxidized when exposed to an ambient containing oxygen.

It should be noted that adhesion layer 22 is optional and is shown in this embodiment because of its advantage in preventing delamination of the material used to form the sensing element (not shown) of a chemical sensor, such as a tin oxide layer. It should be appreciated that, in general, adhesion layer 22 is not a necessary component of metal layer stack 20. For example, the titanium of barrier layer 24 generally provides good adhesion to typical dielectric layers such as silicon oxide. The use of adhesion layer 22 in other applications will depend on the particular materials selected for manufacture.

As one specific example of semiconductor structure 10, top metal layer 26 is a platinum layer having a thickness of about 3,000 angstroms, barrier layer 24 is a titanium layer having a thickness of about 200 angstroms, adhesion layer 22 is a chromium layer having a thickness of about 100 angstroms, lower dielectric layer 14 is a thermal oxide layer of about 2,500 angstroms, upper dielectric layer 16 is a deposited oxide layer of about 5,000 angstroms, and heater 18 is a polysilicon layer of about 4,000 angstroms. The processing used to form structure 10 is conventional except as described below with respect to barrier layer 24.

In this particular embodiment, barrier layer 24 substantially prevents diffusion of platinum and silicon even at elevated operating temperatures up to about 400–450 degrees Celsius (° C.). A result is that substantially no reaction between silicon and platinum is observed at these temperatures. Further, barrier layer 24 of the present invention substantially prevents diffusion of oxygen atoms through it to underlying chromium and silicon regions. This is important in chemical sensors used for sensing ambients containing some oxygen, such as air.

As mentioned above, barrier layer 24 is a titanium layer in which oxygen atoms have been incorporated to an extent sufficient to act as a diffusion barrier, for example, to platinum, silicon, and also oxygen. It is believed that this incorporated oxygen resides as interstitial oxygen atoms in the titanium crystal structure. It should be noted here that barrier layer 24 is preferably pure titanium with oxygen incorporated as described herein. However, it is believed that the barrier layer would also have good barrier characteristics even if small amounts of other materials were contained in it.

In general, oxygen is present in the titanium to an atomic percentage greater than about 2%. However, it is preferred that the atomic percentage be greater than about 11%, at which point the diffusion barrier properties become more observable. Also, it is preferred that the maximum atomic percentage be held below about 30%, because above this point the solubility limit of oxygen in titanium can be reached in which case undesired titanium oxide can be formed, which increases contact resistance.

A desired property of barrier layer 24 is that it does not react with adhesion layer 22 or top metal layer 26. More specifically, no appreciable reaction is observed between a titanium barrier layer having oxygen to an atomic percentage greater than about 11% and a platinum top metal layer, even up to temperatures of 450° C. This is in contrast to a prior pure titanium layer without incorporated oxygen, which reacts with platinum to a significant extent at temperatures greater than about 400° C.

Barrier layer 24 can be formed, for example, by forming a titanium layer in the presence of an ambient containing oxygen atoms, such as diatomic oxygen or water vapor or a mixture thereof. This can be accomplished in one approach by evaporating titanium in the presence of oxygen at a pressure generally greater than about $2\times10^{-6}$ pascals (Pa) and more typically at a pressure of about $2\times10^{-4}$ Pa to $4-10^{-4}$ Pa. The deposition rate of the barrier layer being formed is preferably less than about 10 angstroms/second and even more preferably less than about 5 angstroms/second. The gas in the evaporator chamber contains the oxygen supply necessary for oxygen incorporation into the barrier layer and is provided, for example, by performing the evaporation in the presence of air containing oxygen and, for example, nitrogen. For example, the oxygen supply can come from residual atmosphere that remains in the evaporator chamber just prior to its sealing for processing, or the oxygen supply can come from another source gas that is bled into the evaporator chamber either prior to or during processing. It should be noted that the processing pressures above are significantly higher than those used for current state-of-the-art sputtering in typical semiconductor device manufacture.

It is believed that the higher pressure and slower deposition rate above permit the incorporation of sufficient oxygen into the barrier layer to provide diffusion resistance. The thickness of barrier layer 24 is not critical and can be, for example, less than about 300 angstroms. However, barrier layer 24 can also be thicker than this if desired for certain devices.

Another desirable property of the barrier material used is that it is compatible with a conventional lift-off processing technique. An advantage of the evaporation above of titanium to form the barrier layer 24 is its compatibility with the formation and patterning of metal layer stack 20 (including barrier layer 24) using a conventional lift-off process. This compatibility is an advantage because, for example, platinum layers (as may be used for top metal layer 26) are very difficult to etch and so are most preferably formed by a lift-off process. Also, it should be noted that, unlike the barrier layer of the present invention, other prior barrier materials such as titanium nitride and tantalum nitride cannot be readily evaporated, and thus they are not suitable for lift-off processing.

Although barrier layer 24 is shown and discussed above for an embodiment in which metal layer stack 20 makes contact to a silicon layer overlying substrate 12, the present invention may also be useful for providing a diffusion barrier for contacts to substrate 12 itself. Also, barrier layer 24 is not limited in use to acting as a diffusion barrier for contacts. On the contrary, barrier layer 24 of the present invention is generally useful where it is desired to prevent metal and/or silicon diffusion from one layer to another in a semiconductor device.

As discussed above, barrier layer 24 is useful in chemical sensors operating at elevated temperatures. The present invention is also expected to be useful in the manufacture of ferroelectric dynamic random access memories (DRAMs), in which platinum in contact with titanium is used as a bottom electrode. In such an application, the bottom electrode is exposed to a high-temperature oxidizing environment during the manufacture of the ferroelectric material used, for example barium strontium titanate (BST) or similar materials.

By now, it should be appreciated that there has been provided a novel barrier layer and method formation. The barrier layer provides resistance to diffusion of platinum, silicon, and oxygen, which makes it attractive for use in elevated temperature chemical sensors (especially those exposed to an oxygen-containing ambient).

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for manufacturing a semiconductor structure comprising the steps of:

providing a semiconductor substrate; and forming a barrier layer overlying said semiconductor substrate wherein said barrier layer comprises titanium and oxygen atoms and is formed to have an atomic concentration of said oxygen of greater than about 11%, and wherein the barrier layer is deposited and the oxygen atoms are incorporated into the titanium crystal structure during the deposition of the barrier layer and at a temperature legs than approximately 450° C.

2. A method for manufacturing a semiconductor structure comprising the steps of:

providing a semiconductor substrate; and forming a barrier layer overlying said semiconductor substrate wherein said barrier layer consists essentially of titanium and oxygen atoms, and wherein the barrier layer is deposited and the oxygen atoms are incorporated into the titanium crystal structure during the deposition of the barrier layer and at a temperature less than approximately 450° C.

3. The method for manufacturing said semiconductor structure of claim 2 wherein said step of forming said barrier layer provides said barrier layer with an atomic concentration of said oxygen of greater than about 11%.

4. The method for manufacturing said semiconductor structure of claim 2 wherein said step of forming said barrier layer provides said barrier layer with an atomic concentration of said oxygen of about 11–30%.

5. The method for manufacturing said semiconductor structure of claim 2 further comprising the step of forming a dielectric layer overlying said semiconductor substrate prior to said step of forming said barrier layer.

6. The method for manufacturing said semiconductor structure of claim 2 further comprising the step of forming a top metal layer overlying said barrier layer and wherein said step of forming said barrier layer comprises the step of incorporating said oxygen into said barrier layer to a concentration sufficient to substantially block diffusion from said top metal layer through said barrier layer.

7. The method for manufacturing said semiconductor structure of claim 6 further comprising the step of patterning said top metal layer and said barrier layer using lift-off processing.

8. The method for manufacturing said semiconductor structure of claim 6 wherein said top metal layer comprises platinum.

9. The method for manufacturing said semiconductor structure of claim 6 further comprising the step of forming an adhesion layer overlying a dielectric layer and underlying said barrier layer.

10. The method for manufacturing said semiconductor structure of claim 9 wherein said adhesion layer comprises chromium.

11. The method for manufacturing said semiconductor structure of claim 2 wherein said step of forming said barrier layer comprises incorporating said oxygen into said barrier layer from a supply gas containing oxygen atoms.

12. The method for manufacturing said semiconductor structure of claim 11 wherein said supply gas comprises at least one member of the group consisting of diatomic oxygen and water.

13. The method for manufacturing said semiconductor structure of claim 11 wherein said step of forming said barrier layer is performed at a pressure of greater than about $2\times10^{-6}$ Pa.

14. The method for manufacturing said semiconductor structure of claim 11 wherein said step of forming said barrier layer is performed at a deposition rate of less than about 10 angstroms/second.

* * * * *

UNITED STATES PATENT AND TRADEMARK OFFICE
CERTIFICATE OF CORRECTION

PATENT NO. : 5,926,734
DATED : July 20, 1999
INVENTOR(S) : James Austin Walls

It is certified that error appears in the above-identified patent and that said Letters Patent is hereby corrected as shown below:

<u>Column 4, claim 1,</u>
Line 24, delete "legs" and replace with -- less --.

Signed and Sealed this

Nineteenth Day of March, 2002

Attest:

JAMES E. ROGAN
*Director of the United States Patent and Trademark Office*

*Attesting Officer*